United States Patent
Coban

(10) Patent No.: US 8,542,144 B2
(45) Date of Patent: Sep. 24, 2013

(54) ANALOG TO DIGITAL CONVERTER

(75) Inventor: Abdulkerim L. Coban, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 64 days.

(21) Appl. No.: 13/249,745

(22) Filed: Sep. 30, 2011

(65) Prior Publication Data

US 2013/0082852 A1    Apr. 4, 2013

(51) Int. Cl.
*H03M 1/34* (2006.01)
(52) U.S. Cl.
USPC .......................................... 341/163; 341/155
(58) Field of Classification Search
USPC ............... 341/163, 155, 135, 172, 110, 150, 341/161, 158
See application file for complete search history.

(56) References Cited

U.S. PATENT DOCUMENTS

| | | | |
|---|---|---|---|
| 7,834,793 B2* | 11/2010 | Carreau et al. | 341/155 |
| 8,358,361 B2* | 1/2013 | Hasegawa | 348/300 |
| 2010/0156685 A1* | 6/2010 | Westwick et al. | 341/135 |

* cited by examiner

*Primary Examiner* — Joseph Lauture
(74) *Attorney, Agent, or Firm* — Abel Law Group, LLP

(57) ABSTRACT

An analog to digital converter converts an input analog signal to a digital representation using successive approximation logic to generate a plurality of digital values approximating the analog signal. Evaluation logic evaluates each of the digital values by converting each of the digital values in a digital to analog converter (DAC) to a DAC analog signal and comparing the DAC analog signal to the input analog signal to determine a comparison result used by the successive approximation logic to generate a next one of the digital values. An evaluation time period for one or more bits of the digital representation is longer than for one or more other bits in the digital representation. The DAC includes a resistor ladder. Reference voltages of the DAC are increased for evaluation of the least significant bit (LSB) to obtain more accurate results without increasing a number of resistors.

22 Claims, 9 Drawing Sheets

FIG. 3

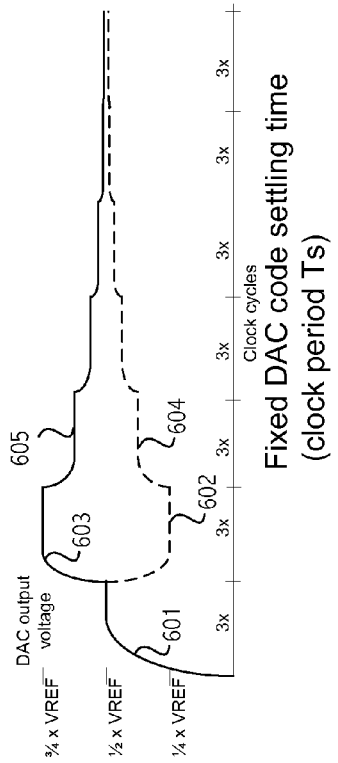
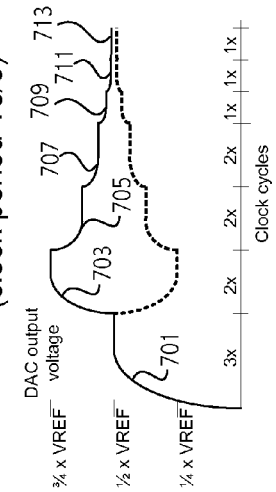
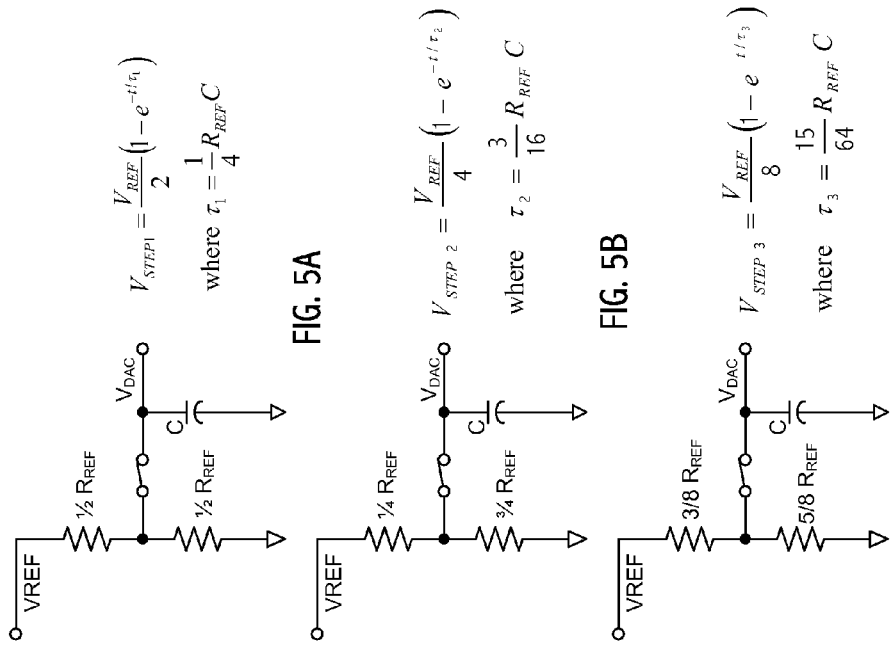

US 8,542,144 B2

ANALOG TO DIGITAL CONVERTER

BACKGROUND

1. Field of the Invention

This application relates to analog to digital converters (ADCs) and in particular to successive approximation register (SAR) ADCs.

2. Description of the Related Art

Conversion from an analog signal to a digital representation of the analog signal is performed in an analog to digital converter (ADC). Such conversion is necessary, for example, to take a sensor input, e.g., a temperature sensor that may be represented by a voltage or current and process that sensor input digitally, e.g., in a microcontroller or other digital logic. Many kinds of ADCs are known in the art. For example, flash and pipelined ADCs require just one cycle to digitize the analog signal and are therefore employed in speed critical applications. However, flash and pipelined ADCs are typically used in designs that are less sensitive to power or area constraints. Accordingly, improved ADCs are desirable for designs that have power and/or area constraints.

SUMMARY

Accordingly, one embodiment provides an analog to digital converter to convert an input analog signal to a digital representation. The ADC includes successive approximation logic configured to successively generate a plurality of digital values approximating the analog signal. Evaluation logic evaluates each of the digital values by converting each of the digital values in a digital to analog converter (DAC) to a DAC analog signal and comparing the DAC analog signal to the input analog signal to determine a comparison result used by the successive approximation logic to generate a next one of the digital values. In order to speed up overall conversion speed, the evaluation time period for one or more bits of the digital representation is shorter than for one or more other bits in the digital representation. Thus, e.g., the LSB evaluation is shorter than the MSB evaluation. For such a variable rate conversion, the ADC may operate with a faster clock such that more than one clock cycle is allocated to bits with longer evaluation times and fewer clock cycles (e.g., one clock cycle) to evaluation of bits with shorter evaluation times.

In another embodiment, a method is provided for converting an input analog signal to a digital representation. The method includes generating successive digital values as corresponding to the input analog signal. The digital values are evaluated with respect to the input analog signal using an evaluation rate that varies, for at least some bits of the digital representation, according to a bit position of the digital representation being evaluated.

In an embodiment an analog to digital converter (ADC) to convert an input analog signal to a digital representation includes successive approximation logic configured to successively generate a plurality of digital values corresponding to the analog signal as part of converting to the digital representation. The ADC further includes a digital to analog converter (DAC) to generate DAC signals corresponding to the digital values. A comparator compares the DAC signals to the input analog signal and supplies a comparison result to the successive approximation logic to generate a next one of the digital values. The DAC includes a resistor ladder and a first circuit to supply a first reference voltage at a first voltage value to the resistor ladder responsive to a first value of a least significant bit (LSB) of the digital representation and to supply the first reference voltage at a second voltage value, different than the first voltage value, responsive to a second value of the LSB of the digital representation.

BRIEF DESCRIPTION OF THE DRAWINGS

The present invention may be better understood, and its numerous objects, features, and advantages made apparent to those skilled in the art by referencing the accompanying drawings.

FIG. 3 illustrates several examples of operation of the SAR ADC.

FIG. 5A illustrates an equivalent circuit for the resistor ladder during an exemplary evaluation stage for an MSB of a code word.

FIG. 5B illustrates an equivalent circuit for the resistor ladder during an exemplary evaluation stage for a next most significant bit of the code word.

FIG. 5C illustrates an equivalent circuit for the resistor ladder during an exemplary evaluation stage for the third most significant bit of the code word.

FIG. 6 illustrates two exemplary fixed rate conversions.

FIG. 7 illustrates two exemplary variable rate conversions.

The use of the same reference symbols in different drawings indicates similar or identical items.

DETAILED DESCRIPTION OF THE PREFERRED EMBODIMENT(S)

Figure 1:
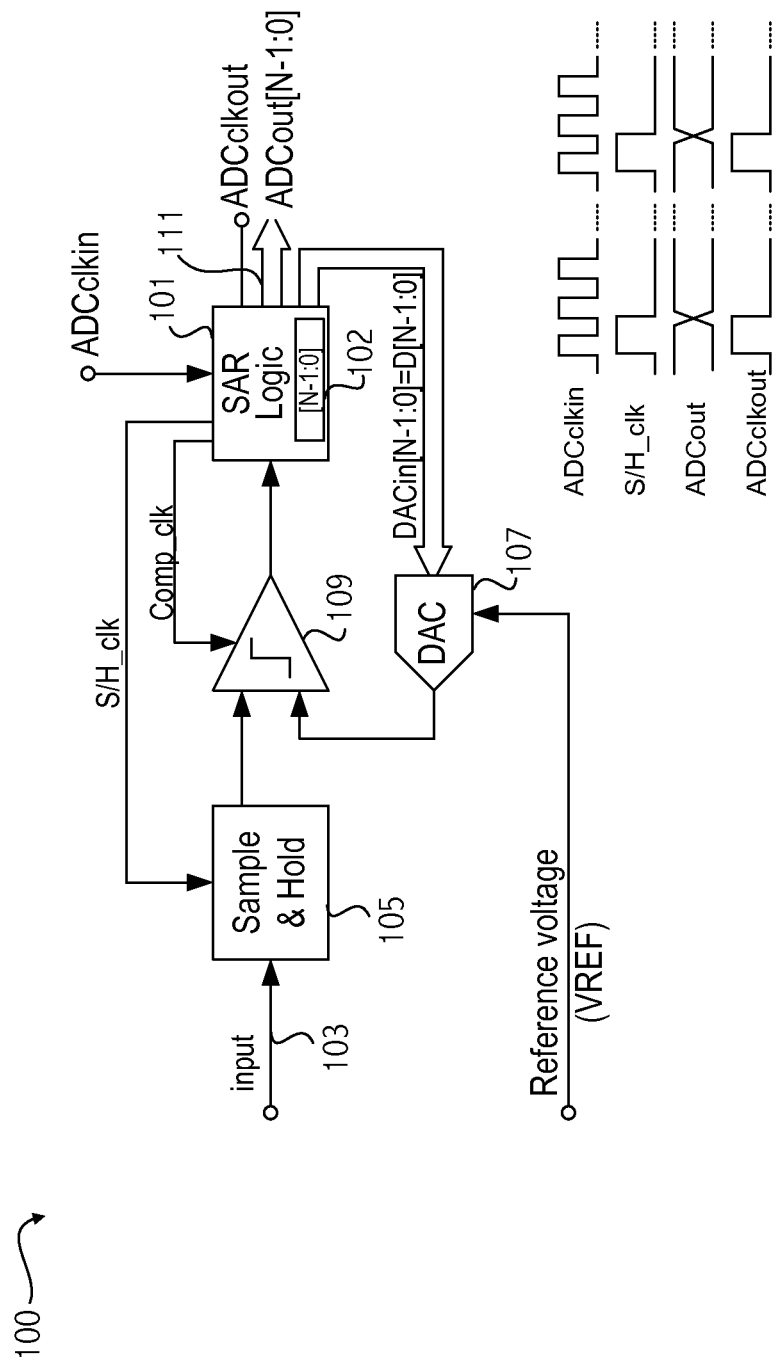
FIG. 1 illustrates an exemplary architecture for an analog to digital converter according to an embodiment of the invention.

FIG. 1 illustrates an exemplary architecture for an analog to digital converter 100 according to an embodiment of the invention. The ADC 100 utilizes Successive Approximation Register (SAR) logic 101 as part of the conversion process. SAR ADCs take at least N cycles to convert an analog input to N-bits of resolution and thus are typically slower compared to flash and pipelined ADCs. SAR ADCs, however, are typically very compact in area and low power and are often used in area and power sensitive designs. In today's state-of-the-art fine-line technologies SAR ADCs can achieve relatively fast conversion rates, e.g., 100 MSample/s for a 10 bit codeword, as explained more fully herein. The input analog signal on node 103 to SAR ADC 100 can be low-speed diagnostic signals, or the SAR ADC may be used, e.g., as part of a temperature sensor, a calibration loop, or an automatic gain control (AGC) loop.

The SAR ADC 100 includes a sample and hold circuit 105 that receives the input analog signal on node 103. The SAR logic 101 generates successive digital values of the analog voltage, each successive value being a more accurate digital representation of the input analog signal. Each digital value is converted to an analog signal in digital to analog converter 107. That converted analog signal is compared to the input analog signal in comparator 109. The comparison result is supplied to SAR logic 101 to enable the SAR logic to generate its next approximation. Exemplary waveforms for the various clock signals are also illustrated showing the relationship between the various clock signals.

Figure 2:
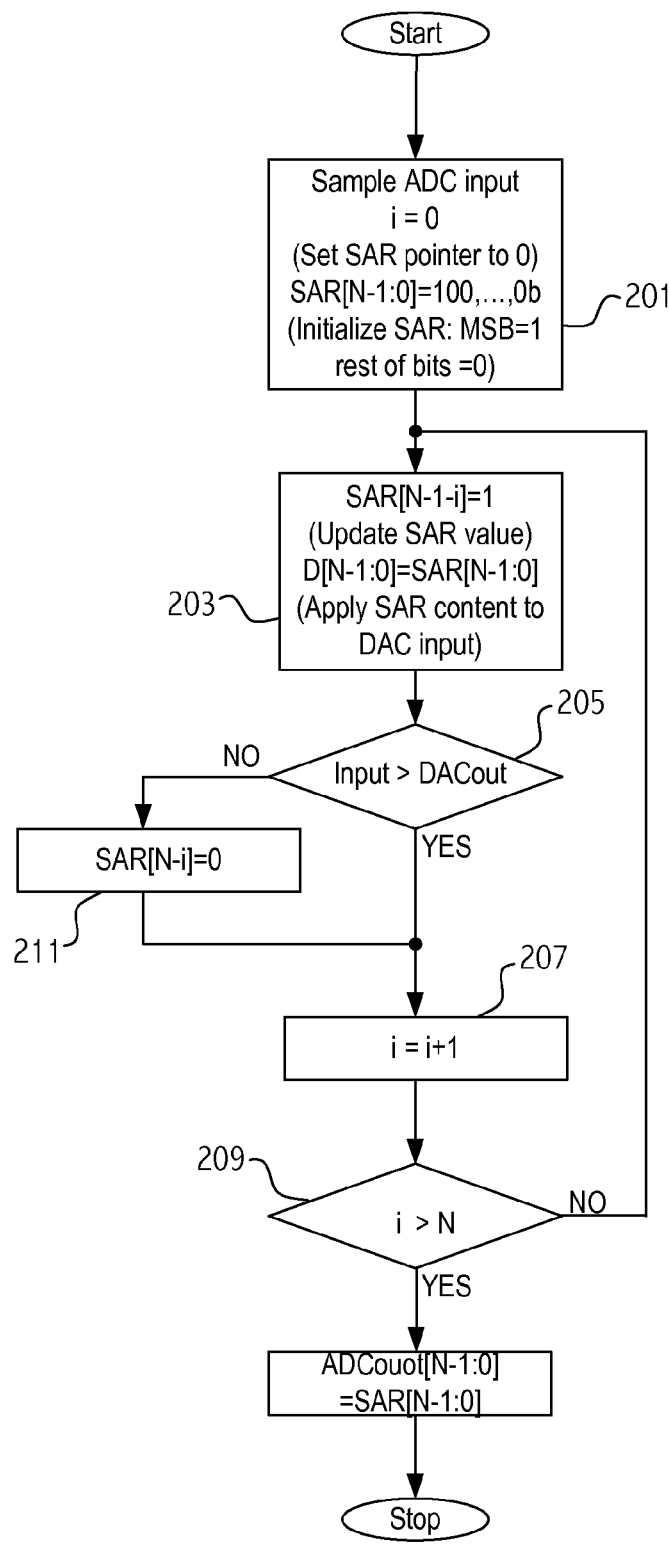
FIG. 2 illustrates a flow chart of the operation of the SAR ADC of FIG. 1.

Operation of the SAR ADC 100 is explained with reference to FIGS. 2 and 3. FIG. 2 illustrates a flow chart of the operation of the SAR ADC 100. At the start of the conversion process, the analog input is sampled, and the SAR pointer "i" is set to zero. The SAR register 102 (SAR[N−1:0]) in SAR logic 101 is set to its midpoint value with the most significant bit of the register at "1" and the rest of the bits set to "0". In 203, the register SAR[N−1−i] is set to 1. With the value of i=0, the MSB is set at 1 with the remaining bits equal to 0. The output bits D[N−1:0] are set equal to the SAR[N−1:0] bits and supplied to the DAC 107 (see FIG. 1). Then the comparison is made in comparator 109 between the output of the DAC 107 and the input analog voltage from the sample and hold circuit 105. In 205, the comparator 109 compares the input analog voltage and the DAC output. If the input analog voltage is greater than the output of the DAC 107, then the index "i" is incremented (i=i+1) in 207. Then a check is made to see if N conversion cycles have been completed in 209 indicating that the conversion is complete. If not yet complete, the flow returns to 203. If the analog to digital conversion is complete, the ADC output 111 is set to the ADC register SAR[N−1:0]. Referring back to 205, if the input analog voltage is smaller than the output of the DAC 107, then the current bit being evaluated SAR[N−i] is set to 0 in 211 and the flow continues at 207 to evaluate the next bit. Note that the SAR logic may be implemented as standalone logic to implement the flow shown in FIG. 2, or may be implemented as a microcontroller or in any manner consistent with operation of the SAR ADC described herein.

Figure 3:
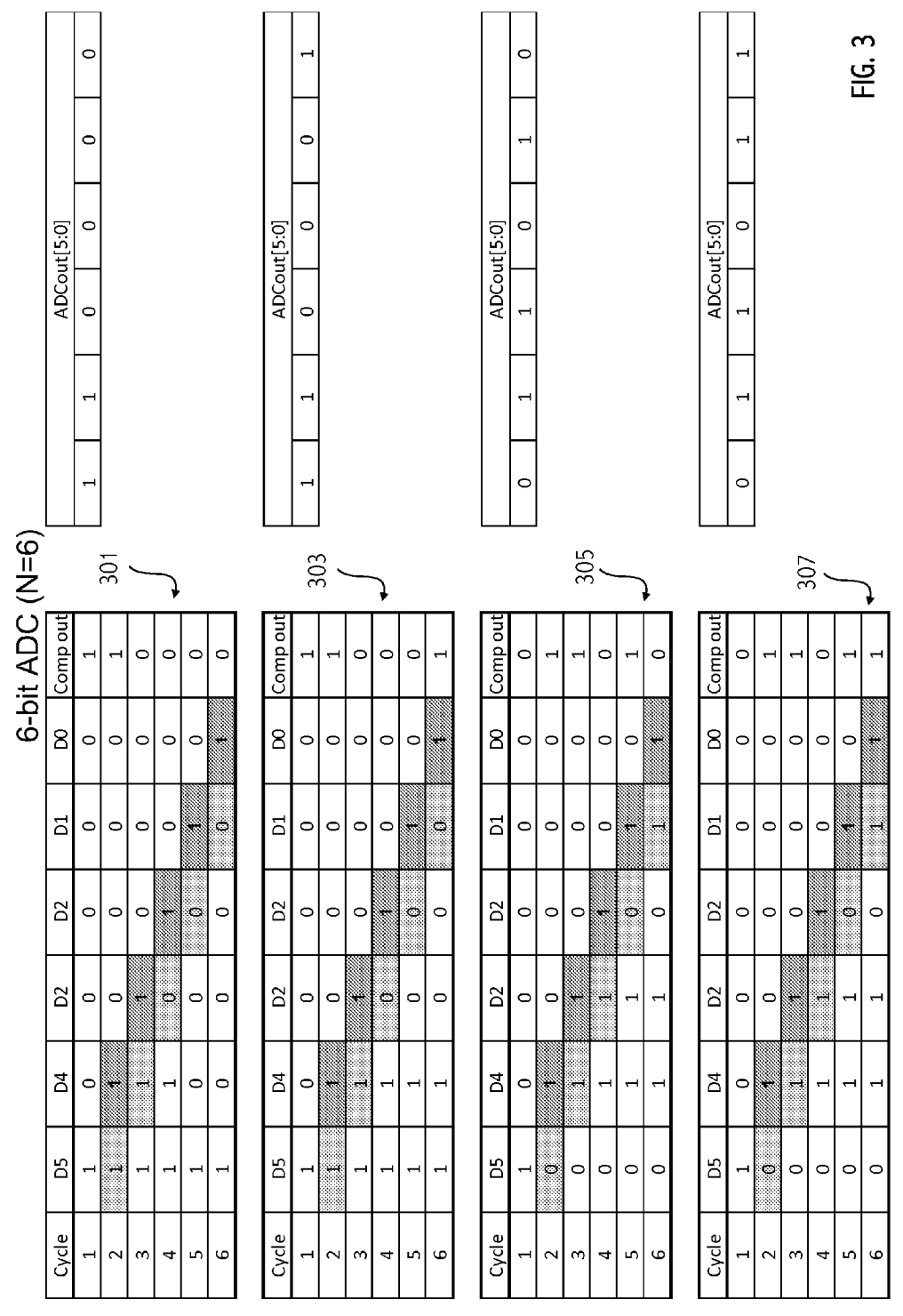

FIG. 3 illustrates several examples of operation of the SAR ADC when N=6, requiring at least 6 cycles to complete the conversion since every bit (SAR[5:0]) has to be evaluated. In addition, another cycle may be allocated to the sample and hold circuit, thus requiring N+1 cycles to complete a conversion. In example 301, the final SAR[N−1:0] value is b'110000. In the first cycle, the MSB SAR[5] is set to 1 and is compared to the analog input. The comparison result for the MSB is shown in the Comp out column. As shown, the comparison result of "1" indicates that the analog input voltage is greater than the DAC output. In that case, the flow goes to 207 and the next bit SAR[4] is set to 1 and the comparison is made. Again the analog input voltage is greater than the DAC output, and so SAR[3] is set to 1. When that comparison is made, the analog input voltage is less than the DAC output, so SAR[3] is set to 0 in 211 and the next bit SAR[2] is set to "1" and evaluated. For the remaining evaluations of the bits, for each comparison, the analog input voltage is less than the DAC output, so the current bit being evaluated is set to 0 and the next bit evaluated is set to "1" until all six bits have been evaluated. After the final evaluation the LSB is set to 0 in step 211 to reflect the comparison results. Examples 303, 305 and 307 illustrate operation of the SAR ADC for additional values.

Figure 4A:
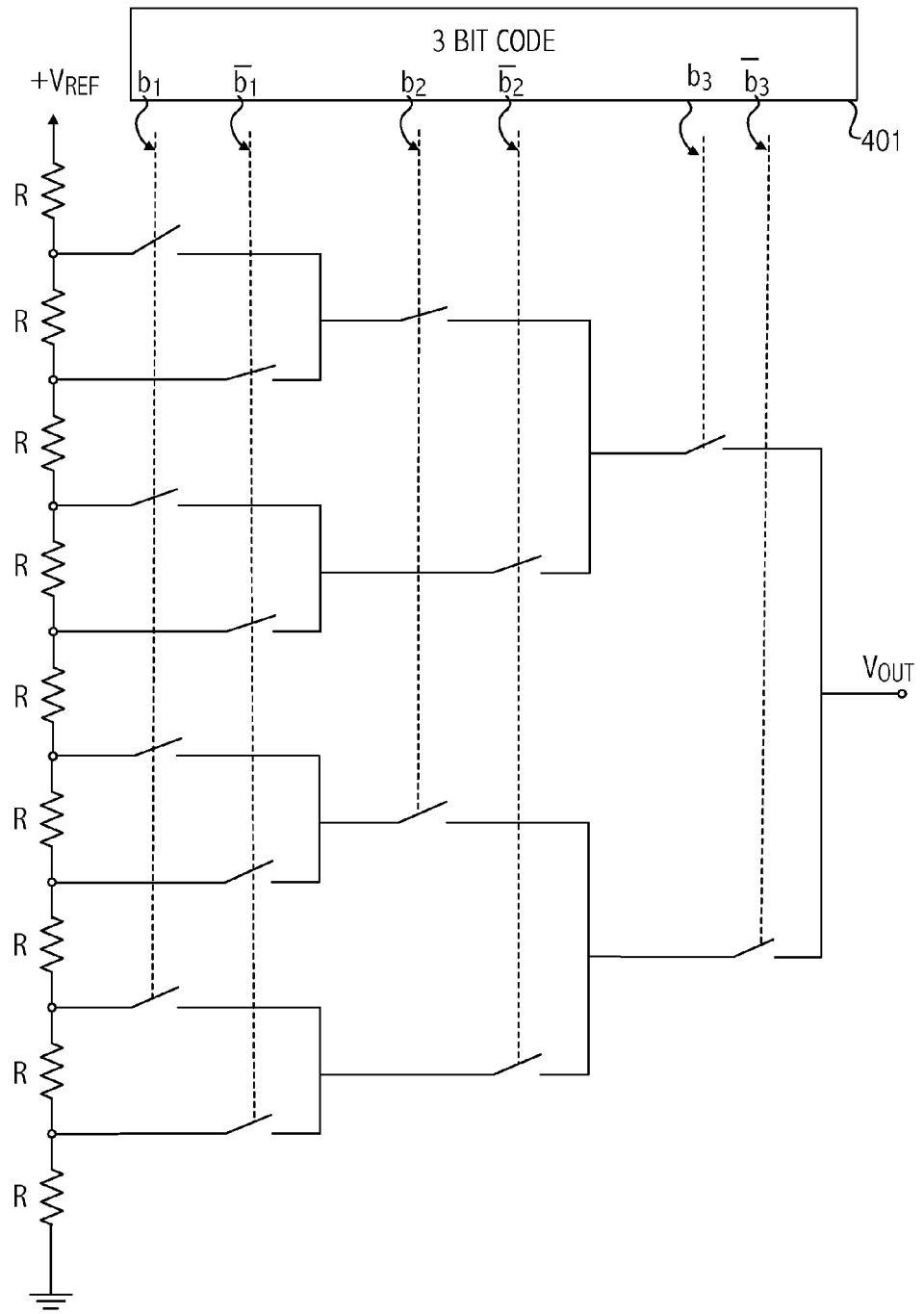
FIG. 4A illustrates an exemplary DAC using a resistor ladder.
Figure 4B:
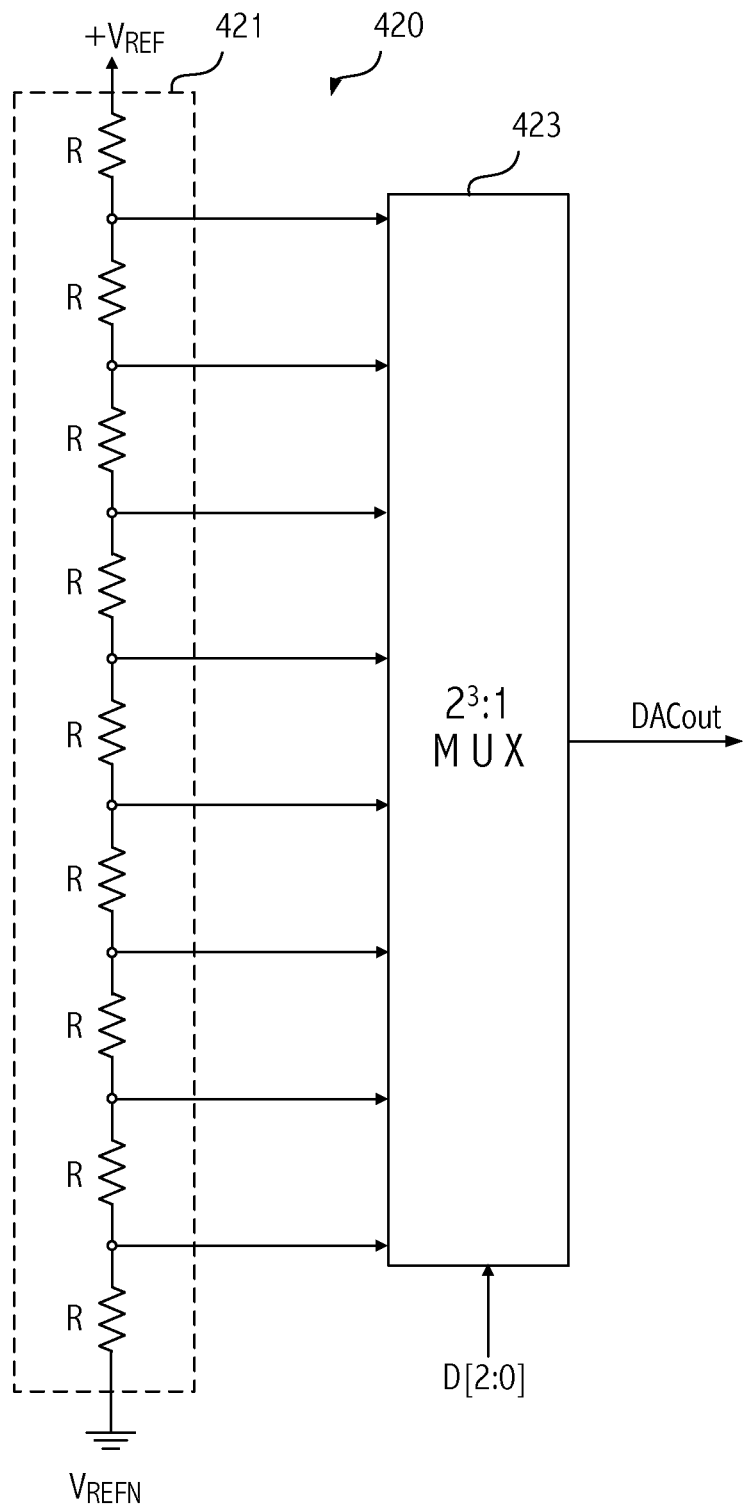
FIG. 4B illustrates another representation of an exemplary DAC using a resistor ladder.

Referring to FIG. 4A, the DAC 107 is shown in an exemplary embodiment as a resistor ladder. For the resistor ladder, a digital value, code 401, is supplied by the SAR logic 101. Each bit of the code controls the corresponding switches shown by the dotted line. For the 3 bit embodiment illustrated, the resistor ladder has 8 segments, or 8 voltages that can be selected. For a 10 bit code, the resistor ladder has 1024 segments. The number of code bits and the corresponding number of segments may depend on the particular application for which the DAC is being utilized. FIG. 4B illustrates another equivalent representation 420 of the resistor ladder of FIG. 4A. The three bit code D[2:0] selects which of eight possible voltages present at the eight segments is selected by selector circuit 423.

While the DAC 107 is shown in FIG. 4 as a resistor ladder, in other embodiments the DAC 107 may be implemented as a switched capacitor DAC. Switched capacitor DACs are faster, take up a larger area and have high switching noise as compared to resistor ladders. Resistor ladders, in contrast, are slower, take up a smaller area, and have lower switching noise. The implementation of the DAC 107 can vary according to the needs of the application in terms of such factors as area, speed, and switching noise. For example, an application needing moderate conversion speed, e.g., up to 1 Msamples/s, may afford the slower conversion speed of the resistor ladder.

The speed limitation of the SAR ADC 100 mainly comes from DAC settling time. One approach that can be used to increase settling speed is to use a variable evaluation time period for the digital bits of the digital word generated by the SAR logic. In such an approach, more clock cycles are allocated to the evaluation of the most significant bits (MSBs) as compared to the evaluation of the least significant bits (LSBs). The same time period may be allocated to the sample and hold (S/H) phase as the evaluation of the MSB(s). As a result, the SAR ADC can be run at higher speed while still allowing sufficient settling time for the S/H phase and evaluation of the DAC MSB(s).

FIGS. 5A, 5B, 5C, and 6 illustrate the generation of SAR bits for an exemplary conversion. FIGS. 5A, 5B, 5C, illustrate the equivalent circuits of the resistor ladder DAC at various stages of the evaluation. FIG. 6 illustrates the settling time for the DAC for two cases of fixed rate evaluation: one of them is for an input slightly above mid-scale (see 601, 603, 605), the other slightly below mid-scale (see 601, 602, 604), both of which represent worst case settling. For each step of the conversion, comparator 109 compares the input analog voltage to the output from DAC 107. The digital word provided by the SAR logic 101 determines the output of DAC 107. The largest DAC output voltage step occurs during MSB evaluation (VREF/2) at 601, which is midscale. The next largest step is followed by MSB-1 (VREF/4) at 603. As can be seen, each succeeding voltage step is smaller with the smallest step being for the LSB. Since each DAC conversion has to settle within a certain fraction (or error) of the voltage value of the LSB regardless of the step size, a longer time is required for settling for the MSBs. That is, assuming the error is the value of the LSB/2, that error is the same for the large voltage swings for the MSB as well as the small voltage swings of the LSB. Thus, it takes longer to achieve settling when the error is a much smaller percentage of the overall voltage swing. In addition, the time constant of the settling waveform is the highest for the MSB, further slowing the settling. FIGS. 5A-5C illustrate the equivalent circuit for generating the first three voltages $V_{STEP1}$, $V_{STEP2}$, and $V_{STEP3}$. FIG. 6 illustrates the generation of the voltage steps including voltages 601, 603, and 605 corresponding to $V_{STEP1}$, $V_{STEP2}$, and $V_{STEP3}$.

$$V_{STEP1} = \frac{V_{REF}}{2}(1 - e^{-t/\tau 1}).$$

The time constant for generation of $V_{STEP1}$ is $\tau 1 = \frac{1}{4} R_{REF} C$. When voltage 601 settles within the error term LSB/2, the conversion for that bit is complete. For generation of the second voltage step 603, the equivalent circuit is shown in FIG. 6B, and $$V_{STEP2} = \frac{V_{REF}}{4}(1 - e^{-t/\tau 2}),$$

where $$\tau 2 = \frac{3}{16} R_{REF} C.$$

Note that $V_{STEP2}$ is the step size (the voltage difference) from $V_{STEP1}$. For generation of the third voltage step 605, the equivalent circuit is shown in FIG. 6C, and $$V_{STEP3} = \frac{V_{REF}}{8}(1 - e^{-t/\tau 3}),$$

where $$\tau 3 = \frac{15}{64} R_{REF} C.$$

Figure 8:
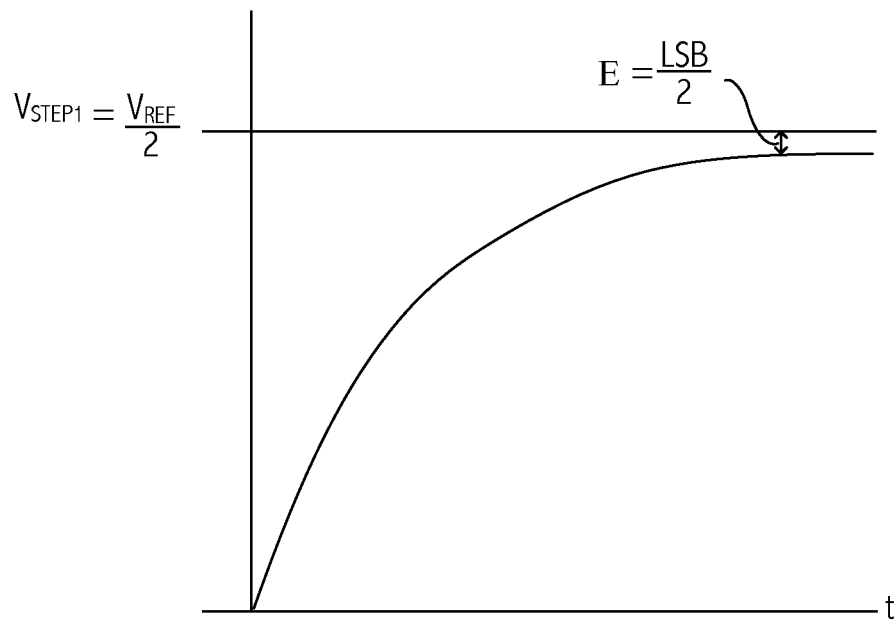
FIG. 8 illustrates generation of the first voltage step.

The third voltage step is associated with the evaluation of the first three bits. Note that the input analog voltage is at midscale so that LSBs also have relatively large time constants. FIG. 8 illustrates generation of $V_{STEP1}$ showing the error (E) equal to the voltage corresponding to LSB/2.

Because the settling time for the MSBs is greater than for the LSBs, if equal time is allocated for settling of each bit, the evaluation of LSBs will be unnecessarily long. By adopting a variable rate DAC evaluation, the overall conversion speed can be increased. For this scheme to work, a faster SAR clock is used. FIG. 7 illustrates an embodiment of the variable rate DAC evaluation approach showing the settling time for the DAC for two cases of variable rate evaluation: one of them is for an input slightly above mid-scale (the solid line), the other for an input slightly below mid-scale (the dashed line) both of which represent worst case settling. For the DAC evaluation example of FIG. 7, assume that a clock that is three times faster than the clock used for the fixed rate conversion is needed for the variable rate conversion. In an embodiment, the MSB is evaluated at 701 in 3 cycles of the faster clock (equal to the duration of one slower clock cycle), the next 3 MSBs 703, 705, 707, are evaluated in 2 cycles of the faster clock and the last three LSBs (709, 711, 713) are evaluated in 1 cycle of the faster clock. Assume sampling is also done in 3 cycles of the faster clock in the sample and hold circuit. With those assumptions, the total number of cycles required for variable rate conversion is 3+3+2+2+2+1+1+1=15 cycles of the faster clock. The fixed rate conversion shown in FIG. 6 requires 8 slower clock cycles (24 fast clock cycles). Thus, the variable rate conversion requires only 62.5 percent of the time for the fixed rate conversion for the examples given in FIGS. 6 and 7. The specific clock speeds and allocation between evaluation stages will of course depend on each particular implementation. The clock speed allocation for each bit can even be programmable so that different applications can maximize speed differently depending on available reference clock frequency. For example, in one embodiment the MSB may get three clock cycles of an available clock and in another embodiment, only two cycles may be allocated because the frequency of the available clock signal is lower.

Another technique to achieve low power and compact area is to use an N−1 bit resistive ladder DAC with reference shifting, instead of an N bit resistive ladder. Use of reference shifting reduces area and power for a given settling time or increases speed for a given power and area. Using reference shifting can provide the advantage of, e.g., an 11 bit DAC in terms of accuracy for the cost of a 10 bit DAC in area and power.

Figure 9:
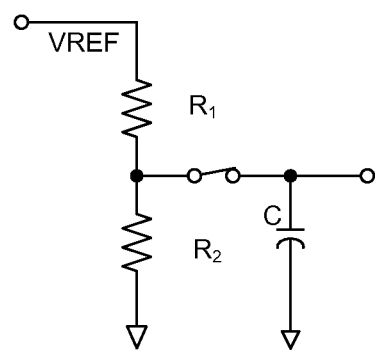
FIG. 9 illustrates an equivalent circuit for a resistor ladder.

Referring to FIG. 9, showing an equivalent circuit for the resistor ladder at a particular code value, the settling time $\tau = R_1 \| R_2 C$ and for the case where $R_1 = R_2$, $\tau = \frac{1}{2} R_1 C$. As capacitance and resistance increases, the settling time increases. Assume for example, a resistive ladder with 1024 segments corresponding to a 10 bit code. To improve the DAC resolution, one could go to 11 bits, which doubles the number of resistors. When the number of resistors is doubled, the parasitic switch and routing capacitance also almost doubles. As a result, settling time slows by a factor of approximately four assuming each resistor value is kept unchanged. In cases where resistors are implemented with the minimum length allowed by the technology, to gain the settling time back, total resistor area must increase to reduce the resistance by increasing resistor width, W. In the general case, assuming no resistor length and matching constraints, to increase from a 10 bit to an 11 bit DAC, the number of resistors doubles from N to 2N (e.g., N=1024 and increases to 2048). To keep the settling time of the 11 bit DAC constant with the settling time of the 10 bit DAC, the resistance of each resistor in the 11 bit implementation must be reduced. Thus, the length of the resistors is halved (L→L/2) and the width of resistors doubled (W→2W) to reduce each resistor value to one-fourth of the original resistance. The total resistance value is halved since there are twice as many one-quarter weight resistors. That keeps the settling time unchanged but results in an area that is twice as big and in addition, the resistor ladder power consumption doubles.

Thus, in order to overcome the drawbacks of increased power and area, or increased settling time, one approach is to shift the resistive ladder reference voltages by, e.g., half of the LSB voltage available from the resistor ladder when the next bit of evaluation is the LSB. That, in effect, provides one more bit of resolution without increasing area and power.

Figure 10A:
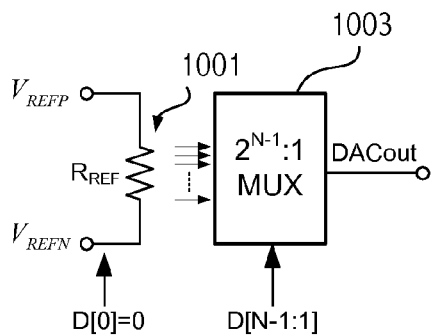
FIGS. 10A and 10B illustrate reference shifting according to an embodiment.
Figure 10B:
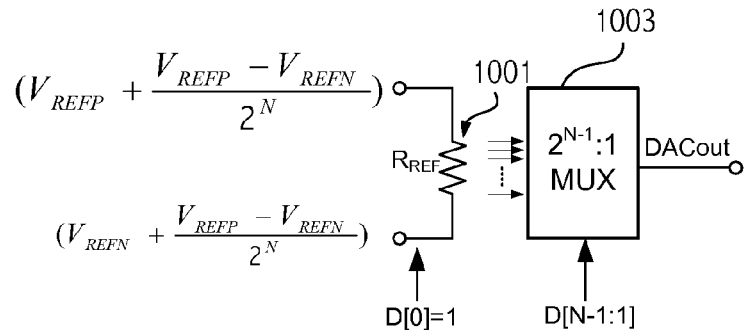

Assume an 11 bit code is generated by the SAR logic 101 (see FIG. 1). Referring to FIG. 10, during the evaluation of the first N−1 MSB bits, reference voltages high and low levels for the resistor ladder are at $V_{REFP}$ and $V_{REFN}$, respectively, and the LSB D[0]=0. The resistor ladder is represented as $R_{REF}$ 1001 in FIG. 10A. The selector circuit 1003 selects the appropriate voltage value corresponding to the digital code D[N−1:1]. In the example being described (N−1)=10, corresponding to an 11 bit code. The bits are evaluated in accordance with, e.g., FIG. 2. In some embodiments, the bits are evaluated with variable bit evaluation times. In other embodiments, fixed evaluation times may be used. Referring to FIG. 10B, during the evaluation of the LSB, reference high and low levels are shifted up by one half of the LSB voltage available from the register ladder, which is $$\frac{V_{REFP} - V_{REFN}}{2^N}..$$

That is, the high reference voltage is set to $$V_{REFP} + \frac{V_{REFP} - V_{REFN}}{2^N}.$$

The low reference voltage is set to $$V_{REFN} + \frac{V_{REP} - V_{REFN}}{2^N}.$$

Figure 11:
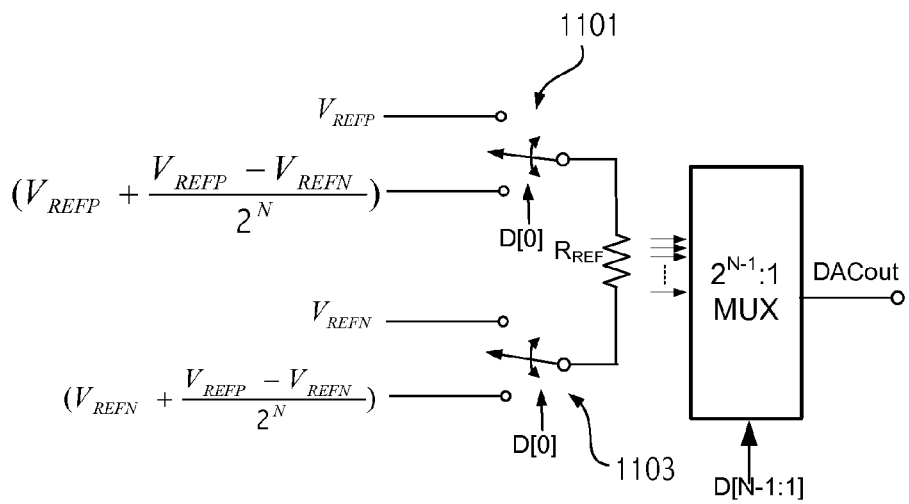
FIG. 11 illustrates another representation of the reference shifting shown in FIGS. 10A and 10B.

FIG. 11 illustrates a combined representation of FIGS. 10A and 10B. Assuming an N bit code is generated by the SAR logic 101, for the first N−1 bits, the SAR logic supplies the digital code word to the resistor ladder with the LSB D[0]=0 and the reference voltages at $V_{REFP}$ and $V_{REFN}$. The value of the LSB controls the switches 1101 and 1103 to select the appropriate reference voltage values. For evaluation of the LSB, since the resistor ladder itself has only N−1 segments, there are no further segments to evaluate. Instead, the reference voltages are shifted up and a comparison made with the shifted reference voltages to the input voltage in comparator 109 (see FIG. 1). If the DAC voltage is less than the input voltage, the LSB is left at "1" and if the DAC voltage is greater than the input voltage, the LSB is set to zero.

Figure 12:
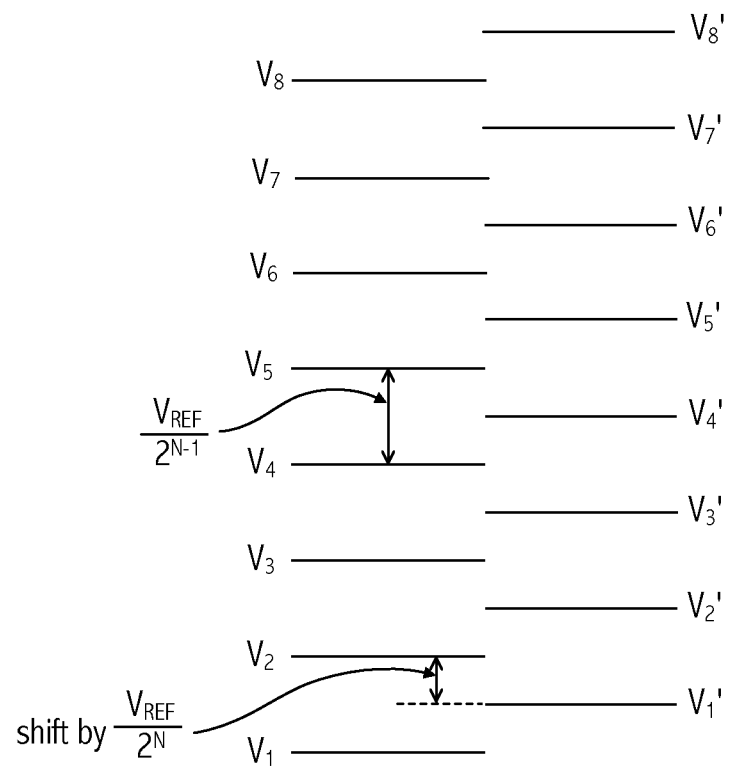
FIG. 12 illustrates the shift in voltages for comparison according to a voltage reference shifting embodiment.

An example is illustrated in FIG. 12 for a simple embodiment with an eight segment DAC ladder (usually a 3 bit code) being used to generate a digital value equivalent to a 16 segment resistor ladder (N=4). After the first three bits of evaluation, eight voltage levels are provided with the voltage step between the voltages equal to $$\frac{V_{REF}}{2^{N-1}},$$

where $V_{REF} = V_{REFP} - V_{REFN}$. However, for the LSB, the voltage levels are shifted by $$\frac{V_{REF}}{2^N}.$$

To keep the example simple, assume VREF=8 volts and the voltage step between V4 and V5 is therefore 1 volt. Assume $V_1$=1V and $V_8$=8V. Assume the input voltage to be converted is 5.7 volts. For the evaluation of the MSB, the code is set to 1000, with each bit representing a half a volt that corresponds to 4V. After comparison, the MSB is kept at one and the next evaluation code is 1100 (6V). That results in a comparison determining that the DAC voltage is larger than the input voltage 5.7V, so the next code word is 1010 (5V), which results in the comparator comparing 5.7V to 5V (and determines the next to last bit should be kept at one). For the LSB, the comparator compares 5.7 V to a shifted voltage of 5.5V and determines the LSB should be set to one. The final code generated is 1011, which represents 5.5V. For the price of an N−1 DAC ladder, N bits of precision are obtained.

The reference shifting approach may be extended after the first reference shift by shifting the voltage up by half of the previous step value (here the next shift would be $$\frac{V_{REF}}{2^{N+1}}).$$

In practice, however, there may be accuracy issues that limit the use of the reference shifting technique beyond the first reference shift.

Thus, two approaches have been described that provide improved power and area for an ADC. One approach uses variable rate conversion and the second approach uses the voltage reference shifting. In various embodiments, the two approaches may be used together or separately. The description of the invention set forth herein is illustrative, and is not intended to limit the scope of the invention as set forth in the following claims. For example, variable rate conversion can be used without reference voltage shifting and reference voltage shifting may be used without variable rate conversion. Other variations and modifications of the embodiments disclosed herein, may be made based on the description set forth herein, without departing from the scope of the invention as set forth in the following claims.

What is claimed is:

1. An analog to digital converter to convert an input analog signal to a digital representation comprising:
   successive approximation logic configured to successively generate a plurality of digital values approximating the analog signal; and
   evaluation logic to evaluate each of the digital values by converting each of the digital values in a digital to analog converter (DAC) to a DAC analog signal and compare the DAC analog signal to the input analog signal to determine a comparison result used by the successive approximation logic to generate a next one of the digital values;
   wherein an evaluation time period for one or more bits of the digital representation is shorter than for one or more other bits in the digital representation; and
   wherein the evaluation time period varies according to bit position, the evaluation time period of a most significant bit of the digital representation being longer than the evaluation time period of a least significant bit of the digital representation.

2. The analog to digital converter as recited in claim 1, wherein the evaluation logic comprises the digital to analog converter coupled to receive the digital values.

3. The analog to digital converter as recited in claim 2 further comprising:
   a comparator to compare the input analog signal to each of the DAC analog signals and supply the comparison result to the successive approximation logic to determine whether to increase or decrease a next digital value with respect to a current digital value.

4. The analog to digital converter as recited in claim 2 wherein the digital to analog converter comprises a resistor ladder.

5. The analog to digital converter as recited in claim 4 further comprising
   a first circuit to supply a first reference voltage at a first voltage value to the resistor ladder responsive to a first value of a least significant bit of the digital representation and to supply the first reference voltage at a second voltage value, different than the first voltage value, responsive to a second value of the least significant bit of the digital representation.

6. The analog to digital converter as recited in claim 5 wherein the second voltage value is higher than the first voltage value.

7. The analog to digital converter as recited in claim 6 wherein the second value of the least significant bit is a one.

8. The analog to digital converter as recited in claim 5 further comprising a second circuit to supply a second reference voltage at a third voltage value to the resistor ladder responsive to the first value of a least significant bit of the digital representation and to supply the second reference voltage at a fourth voltage value, different than the third voltage value, responsive to the second value of the least significant bit of the digital representation.

9. A method for converting an analog signal to a digital representation comprising:
   generating successive digital values of the digital representation; and
   evaluating each of the successive digital values with respect to the analog signal using an evaluation time that varies, for at least some bits of the digital representation, according to a bit position of the digital representation being evaluated, the evaluation time being less for at least some less significant bits as compared to at least some more significant bits of the digital representation.

10. The method as recited in claim 9 further comprising: converting each of the digital values to respective analog signals.

11. The method as recited in claim 10 wherein the evaluating includes supplying each of the digital values to a digital to analog converter and generating analog voltages corresponding to respective ones of the digital values.

12. The method as recited in claim 11 further comprising:
   comparing the analog voltages to the analog signal to generate respective comparison results; and
   using respective ones of the comparison results to generate respective ones of the successive digital values.

13. The method as recited in claim 11 wherein the digital to analog converter includes a plurality of resistors formed as a resistor ladder.

14. The method as recited in claim 9 further comprising:
   using a first number of cycles of a clock signal to evaluate a most significant bit of the digital representation; and
   using a second number of cycles of the clock signal, to evaluate a least significant bit of the digital representation, the first number being larger than the second number.

15. A method for converting an analog signal to a digital representation comprising:
   generating successive digital values of the digital representation;
   evaluating each of the successive digital values with respect to the analog signal, the evaluating including supplying each of the digital values to a digital to analog converter formed as a resistor ladder and generating analog voltages corresponding to respective ones of the digital representation;
   changing reference voltages supplied to the resistor ladder for evaluation of a least significant bit of the digital representation.

16. The method as recited in claim 15 further comprising changing a high reference voltage of the reference voltages to be $$V_{REFP} + \frac{V_{REFP} - V_{REFN}}{2^N},$$

where $V_{REFP}$ is a value of the high reference voltage used to evaluate high order bits of the digital value and $V_{REFN}$ is a value of a low reference voltage used to evaluate the high order bits of the digital value.

17. The method as recited in claim 16 further comprising changing the value of the low reference voltage to be $$V_{REFN} + \frac{V_{REFP} - V_{REFN}}{2^N}.$$

18. The method as recited in claim 15 further comprising evaluating each of the successive digital values with respect to the analog signal using an evaluation time that varies, for at least some bits of the digital representation, according to a bit position of the digital representation being evaluated.

19. An analog to digital converter to convert an input analog signal to a digital representation comprising:
   successive approximation logic configured to successively generate a plurality of digital values corresponding to the analog signal to generate the digital representation;
   a digital to analog converter (DAC) to generate DAC signals corresponding to the digital values;
   a comparator to compare the DAC signals to the input analog signal and supply a comparison result to the successive approximation logic to generate a next one of digital values,
   wherein the DAC includes,
     a resistor ladder; and
     a first circuit to supply a first reference voltage at a first voltage value to the resistor ladder responsive to a first value of a least significant bit of the digital representation and to supply the first reference voltage at a second voltage value, different than the first voltage value, responsive to a second value of the least significant bit of the digital representation.

20. The analog to digital converter as recited in claim 19 wherein the second voltage value is higher than the first voltage value.

21. The analog to digital converter as recited in claim 19 wherein the second value of the least significant bit is a one.

22. The analog to digital converter as recited in claim 19 further comprising a second circuit to supply a second reference voltage at a third voltage value to the resistor ladder responsive to the first value of a least significant bit of the digital representation and to supply the second reference voltage at a fourth voltage value, different than the third voltage value, responsive to the second value of the least significant bit of the digital representation.

* * * * *